US006969575B2

(12) United States Patent
Inno

(10) Patent No.: US 6,969,575 B2
(45) Date of Patent: Nov. 29, 2005

(54) ON-PRESS DEVELOPABLE LITHOGRAPHIC PRINTING PLATE PRECURSOR

(75) Inventor: Toshifumi Inno, Shizuoka (JP)

(73) Assignee: Fuji Photo Film Co., Ltd., Kanagawa (JP)

( * ) Notice: Subject to any disclaimer, the term of this patent is extended or adjusted under 35 U.S.C. 154(b) by 69 days.

(21) Appl. No.: 10/647,428

(22) Filed: Aug. 26, 2003

(65) Prior Publication Data

US 2004/0048191 A1 Mar. 11, 2004

(30) Foreign Application Priority Data

Aug. 29, 2002 (JP) .................................... P. 2002-251932
Aug. 29, 2002 (JP) .................................... P. 2002-251933

(51) Int. Cl.[7] ............................ G03F 7/09; G03F 7/105

(52) U.S. Cl. ................. 430/138; 430/270.1; 430/280.1; 430/281.1; 430/286.1

(58) Field of Search ............................. 430/138, 270.1, 430/280.1, 281.1, 286.1

(56) References Cited

U.S. PATENT DOCUMENTS 6,649,311 B1 * 11/2003 Shirley et al. ................ 430/15
6,794,104 B2 * 9/2004 Tashiro ....................... 430/138

FOREIGN PATENT DOCUMENTS

| | | | |
|---|---|---|---|
| EP | 0 646 476 | A1 | 4/1995 |
| EP | 1 203 660 | A1 | 5/2002 |
| EP | 1 287 985 | A2 | 3/2003 |
| JP | 9-127683 | A | 5/1997 |
| JP | 2938397 | B2 | 6/1999 |
| JP | 2001-277740 | A | 10/2001 |
| JP | 2002-29162 | A | 1/2002 |
| JP | 2002-46361 | A | 2/2002 |
| JP | 2002-137562 | A | 5/2002 |
| WO | WO 99/10186 | A1 | 3/1999 |

* cited by examiner

*Primary Examiner*—Barbara L. Gilliam
(74) *Attorney, Agent, or Firm*—Sughrue Mion, PLLC

(57) ABSTRACT

An on-press developable heat-sensitive lithographic printing plate precursor comprising: a support having a water-wettable surface; and an image forming layer, wherein the image forming layer comprises microcapsules containing a lipophilic compound and one of a leuco dye which forms a color by an action of an acid and a dye which reduces the maximum absorption intensity in a visible region by an action of an acid, an acid generator capable of generating an acid on heat application, and a light-heat converting substance.

18 Claims, No Drawings

ON-PRESS DEVELOPABLE LITHOGRAPHIC PRINTING PLATE PRECURSOR

FIELD OF THE INVENTION

This invention relates to an on-press developable heat-sensitive lithographic printing plate precursor comprising a water-wettable support and an image forming layer containing microcapsules. More particularly, it relates to a heat-sensitive lithographic printing plate precursor which is fit for imaging by infrared scanning exposure based on digital signals and for on-press development and capable of forming a printed-out image on imagewise exposure.

BACKGROUND OF THE INVENTION

Computer-to-plate (CTP) technology has recently seen marked development, and a number of studies have been given to printing plate precursors for CTP. In pursuit of further streamlining the platemaking process and addressing the waste water problem, plate precursors that can be mounted on a printing press after imagewise exposure without requiring chemical development have been researched, and various techniques have been proposed to date.

A so-called on-press development system is one of the methods realizing processless platemaking, in which an exposed printing plate precursor is fixed on the plate cylinder of a printing press, and a fountain solution and ink are fed thereto while revolving the cylinder to remove non-image areas. This technique allows an exposed printing plate precursor to be mounted as is on a press and be made into a printing plate on an ordinary printing line. A lithographic printing plate precursor fit for the on-press development is required to have an image forming layer soluble in a fountain solution or an ink solvent and to have daylight handling properties for on-press development.

For example, Japanese Patent 2938397 discloses a lithographic printing plate precursor having, on a water-wettable support, a photosensitive layer made of thermoplastic hydrophobic polymer particles dispersed in a hydrophilic binder resin. According to the teachings, the precursor is exposed to an infrared laser beam to thermally bind the thermoplastic hydrophobic polymer particles to form an image, fixed to the cylinder of a printing press, and on-press developed with a fountain solution and/or ink. Designed to have sensitivity to the infrared region, the precursor is daylight safe.

JP-A-9-127683 and WO99/10186 also propose on-press platemaking after thermally binding fine thermoplastic particles.

JP-A-2001-277740 discloses an on-press developable lithographic printing plate precursor which comprises microcapsules containing a heat-reactive compound and enjoys an extended press life.

JP-A-2002-29162 alleges that a lithographic printing plate with a satisfactory press life is obtained from an on-press developable lithographic printing plate precursor of which the image forming layer comprises vinyloxy compound-containing microcapsules, a hydrophilic resin, and an acid generator.

JP-A-2002-46361 teaches that an on-press developable lithographic printing plate precursor of which the image forming layer comprises a microencapsulated epoxy compound, a hydrophilic resin, and an acid generator provides a printing plate with a satisfactory press life.

JP-A-2002-137562 teaches that an on-press developable lithographic printing plate precursor of which the image forming layer comprises a microencapsulated radical polymerizable compound, a hydrophilic resin, and an acid generator provides a printing plate with a satisfactory press life.

SUMMARY OF THE INVENTION

It is a practice generally followed before mounting a printing plate on a press to check out any image defects or identify the color specificity of the plate. This is the same with an on-press developable plate precursor. However, since the plate precursor as exposed has no visible image but a latent one, it is impossible to identify the precursor, which can result in a mistake of using a wrong plate.

An object of the present invention is to provide an on-press developable heat-sensitive lithographic printing plate precursor capable of forming a printed-out image on imagewise exposure, whereby the exposed plate is easy to identify.

The above object is accomplished by an on-press developable heat-sensitive lithographic printing plate precursor comprising a support having a water-wettable surface and an image forming layer provided thereon, wherein the image forming layer comprises microcapsules containing a lipophilic compound and a dye which reduces the maximum absorption intensity in the visible region by the action of an acid, an acid generator capable of generating an acid on heat application, and a light-heat converting substance.

Also, the above object is accomplished by an on-press developable heat-sensitive lithographic printing plate precursor comprising a support having a water-wettable surface and an image forming layer provided thereon, wherein the image forming layer comprises microcapsules containing a lipophilic compound and a leuco dye which forms a color by the action of an acid, an acid generator capable of generating an acid on heat application, and a light-heat converting substance.

In a preferred embodiment of the invention, the acid generator is water-soluble, present outside the microcapsules, and isolated from the microencapsulated dye.

DETAILED DESCRIPTION OF THE INVENTION

The image forming layer contains microcapsules having a lipophilic compound and a dye microencapsulated therein, the dye being a leuco dye which forms a color by the action of an acid or a dye which reduces the maximum absorption intensity in the visible region by the action of an acid.

The lipophilic compound is preferably a compound having a heat-reactive group. Any heat-sensitive functional group capable of forming a chemical bond through any mode of reaction serves as the heat-reactive group. Suitable heat-reactive functional groups include ethylenically unsaturated groups undergoing radical polymerization (e.g., acryloyl, methacryloyl, vinyl, and allyl); cation polymerizable groups (e.g., vinyl and vinyloxy); a blocked or non-blocked isocyanate group, an epoxy group or a vinyloxy group capable of addition reaction and a functional group having active hydrogen reactive with these groups (e.g., amino, hydroxyl or carboxyl); a carboxyl group capable of condensation reaction and a hydroxyl group or an amino group reactive therewith; and an acid anhydride group capable of ring-opening addition reaction and an amino group or a hydroxyl group reactive therewith. The lipophilic compounds having the heat-reactive functional group will be described in more detail.

Compounds having a radical polymerizable unsaturated group include those having at least one, preferably two or more ethylenically unsaturated functional groups selected from an acryloyl group, a methacryloyl group, a vinyl group, an allyl group, etc. They are widely known in the art as a monomer or a crosslinking agent for a light or heat polymerizable composition. The lipophilic compound for use in the invention can be chosen from among them with no particular restriction. The compound to be used may be in the form of a monomer, a prepolymer (i.e., a dimer, a trimer or an oligomer), a homo- or copolymer, or a mixture thereof.

Compounds having a radical polymerizable unsaturated group that are particularly preferred in the invention include, but are not limited to, those described in JP-A-2001-277740, such as trimethylolpropane di(meth)acrylate, trimethylolpropane tri(meth)acrylate, pentaerythritol di(meth)acrylate, pentaerythritol tri(meth)acrylate, pentaerythritol tetra(meth) acrylate, dipentaerythritol di(meth)acrylate, dipentaerythritol penta(meth)acrylate, dipentaerythritol hexa(meth) acrylate, and a trimethylolpropane diacrylate/xylylene diisocyanate adduct.

Examples of suitable compounds having a vinyloxy group include, but are not limited to, those described in JP-A-2002-29162, such as ethylene glycol divinyl ether, triethylene glycol divinyl ether, 1,3-butanediol divinyl ether, tetramethylene glycol divinyl ether, neopentyl glycol divinyl ether, trimethylolpropane trivinyl ether, trimethylolethane trivinyl ether, hexanediol divinyl ether, 1,4-cyclohexanediol divinyl ether, tetraethylene glycol divinyl ether, pentaerythritol divinyl ether, pentaerythritol trivinyl ether, pentaerythritol tetravinyl ether, sorbitol tetravinyl ether, sorbitol pentavinyl ether, ethylene glycol diethylenevinyl ether, triethylene glycol diethylenevinyl ether, ethylene glycol dipropylenevinyl ether, trimethylolpropane triethylenevinyl ether, trimethylolpropane diethylenevinyl ether, pentaerythritol diethylenevinyl ether, pentaerythritol triethylenevinyl ether, pentaerythritol tetraethylenevinyl ether, 1,2-bis (vinyloxymethoxy)benzene,
1,2-bis[2-(vinyloxy)ethyloxy]benzene,
1,4-bis[2-(vinyloxy)ethyloxy]benzene,
1,3-bis[2-(vinyloxy)ethyloxy]benzene,
1,3,5-tris[2-(vinyloxy)ethyloxy]benzene,
4,4'-bis[2-(vinyloxy)ethyloxy]biphenyl,
4,4'-bis[2-(vinyloxy)ethyloxy]diphenyl ether,
4,4'-bis[2-(vinyloxy)ethyloxy]diphenylmethane,
1,4-bis[2-(vinyloxy)ethyloxy]naphthalene,
2,5-bis[2-(vinyloxy)ethyloxy]furan,
2,5-bis[2-(vinyloxy)ethyloxy]thiophene,
2,5-bis[2-(vinyloxy)ethyloxy]imidazole,
2,2-bis[4-(2-(vinyloxy)ethyloxy)phenyl]propane,
2,2-bis[4-(vinyloxymethyloxy)phenyl]propane, and
2,2-bis[4-(vinyloxy)phenyl]propane.

Compounds having an epoxy group preferably contain two or more epoxy groups, including glycidyl ether compounds obtained by the reaction between a polyhydric alcohol or a polyhydric phenol and epichlorohydrin and prepolymers thereof and homo- or copolymers of glycidyl acrylate or glycidyl methacrylate.

Suitable compounds having two or more epoxy groups include glycerol polyglycidyl ether, polyethylene glycol diglycidyl ether, polypropylene glycol diglycidyl ether, neopentyl glycol diglycidyl ether, trimethylolpropane polyglycidyl ether, and sorbitol polyglycidyl ether. Additionally included are polyglycidyl ethers of bisphenols, hydrogenated bisphenols, polyphenols or hydrogenated polyphenols, such as hydrogenated bisphenol A diglycidyl ether, hydroquinone diglycidyl ether, resorcinol diglycidyl ether, bisphenol A (or F) diglycidyl ether, bisphenol A (or F)/epichlorohydrin polyaddition products, halogenated bisphenol A diglycidyl ethers, halogenated bisphenol A/epichlorohydrin polyaddition products, biphenyl bisphenol diglycidyl ether, and biphenyl bisphenol/epichlorohydrin polyaddition products. Methyl methacrylate/glycidyl methacrylate copolymers and ethyl methacrylate/glycidyl methacrylate copolymers are also suitable.

These epoxy compounds are commercially available under trade names of Epikote 1001 (molecular weight: ca. 900; epoxy equivalent: 450 to 500), Epikote 1002 (molecular weight: ca. 1600; epoxy equivalent: 600 to 700), Epikote 1004 (molecular weight: ca. 1060; epoxy equivalent: 875 to 975), Epikote 1007 (molecular weight: ca. 2900; epoxy equivalent: 2000), Epikote 1009 (molecular weight; 3750; epoxy equivalent: 3000), Epikote 1010 (molecular weight: ca. 5500; epoxy equivalent: 4000), Epikote 1100L (epoxy equivalent: 4000), and Epikote YX31575 (epoxy equivalent: 1200) (all the Epikote series are available from Japan Epoxy Resins Co., Ltd.); and Sumi-epoxy ESCN series (e.g., 195XHN, 195XL, and 195XF) available from Sumitomo Chemical Co., Ltd.

Suitable isocyanate compounds include tolylene diisocyanate, diphenylmethane diisocyanate, polymethylenepolyphenyl polyisocyanate, xylylene diisocyanate, naphthalene diisocyanate, cyclohexanephenylene diisocyanate, isophorone diisocyanate, hexamethylene diisocyanate, and cyclohexylene diisocyanate; and corresponding isocyanate compounds having their isocyanate groups blocked with an alcohol or an amine.

Suitable amine compounds include ethylenediamine, diethylenetriamine, triethylenetetramine, hexamethylenediamine, propylenediamine, and polyethyleneimine.

Suitable hydroxyl-containing compounds include compounds having a methylol end group, polyhydric alcohols (e.g., pentaerythritol), bisphenols, and polyphenols.

Suitable carboxyl-containing compounds include aromatic polycarboxylic acids, such as pyromellitic acid, trimellitic acid, and phthalic acid, and aliphatic polycarboxylic acids, such as adipic acid.

Suitable acid anhydrides include pyromellitic anhydride and benzophenonetetracarboxylic acid anhydride.

The image forming layer contains an acid generator capable of generating an acid on heat application, and a leuco dye that forms a color on contact with the acid generated by the acid generator or a dye that reduces its maximum absorption intensity in the visible region on contact with the acid generated by the acid generator. By this formulation, the image forming layer forms a printed-out image on exposure, thereby enabling a worker to identify the exposed printing plate precursor. The visibility of the printed-out image increases with a density contrast between exposed and unexposed areas. It is desirable that the density difference between the exposed and unexposed areas be 0.1 or more, particularly 0.3 or more, as measured with a reflection densitometer.

The dyes microencapsulated therein used in the present invention for forming the printed-out image are explained below.

The leuco dye that forms a printed-out image by the action of an acid includes colorless to faintly colored compounds having a lactone, sultone, lactam, spiropyran or like structure and capable of color formation by the action of an acid.

Examples of such leuco dyes include, but are not limited to, Crystal Violet Lactone, Malachite Green Lactone, Benzoyl Leuco Methylene Blue, 2-(N-phenyl-N-methylamino)-6-(N-p-tolyl-N-ethyl)aminofluor an, 2-anilino-3-methyl-6-(N-ethyl-p-toluidino)fluoran, 3,6-dimethoxyfluoran, 3-(N,N-diethylamino)-5-methyl-7-(N,N-dibenzylamino)fluoran, 3-(N-cyclohexyl-N-methylamino)-6-methyl-7-anilinofluoran, 3-(N,N-diethylamino)-6-methyl-7-anilinofluoran, 3-(N-diethylamino)-6-methyl-7-xylidinofluoran, 3-(N,N-diethylamino)-6-methyl-7-chlorofluoran, 3-(N,N-diethylamino)-6-methoxy-7-aminofluoran, 3-(N,N-diethylamino)-7-(4-chloroanilino)fluoran, 3-(N,N-diethylamino)-7-chlorofluoran, 3-(N,N-diethylamino)-7-benzylaminofluoran, 3-(N,N-diethylamino)-7,8-benzofluoran, 3-(N,N-dibutylamino)-6-methyl-7-anilinofluoran, 3-(N,N-dibutylamino)-6-methyl-7-xylidinofluoran, 3-piperidino-6-methyl-7-anilinofluoran, 3-pyrrolidino-6-methyl-7-anilinofluoran, 3,3-bis(1-ethyl-2-methylindol-3-yl)phthalide, 3,3-bis(1-n-butyl-2-methylindol-3-yl)phthalide, 3,3-bis(p-dimethylaminophenyl)-6-dimethylaminophthalide, 3-(4-diethylamino-2-ethoxyphenyl)-3-(1-ethyl-2-methylindol-3-yl)-4-azaphthalide, and 3-(4-diethylaminophenyl)-3-(1-ethyl-2-methylindol-3-yl)pht halide.

The dye that reduces its maximum absorption intensity in the visible region by the action of an acid includes organic solvent soluble dyes of various types, such as diphenylmethanes, triphenylmethanes, thiazines, oxazines, xanthenes, anthraquinones, iminonaphthoquinones, and azomethines.

Specific examples of such dyes are Brilliant Green, Ethyl Violet, Methyl Green, Crystal Violet, Basic Fuchsin, Quinaldine Red, Rose Bengal, Methanyl Yellow, Thymolsulfophthalein, Xylenol Blue, Methyl Orange, Paramethyl Red, Benzopurpurin 4B, α-Naphthyl Red, Nile Blue 2B, Nile Blue A, Malachite Green, Parafuchsin, Victoria Pure Blue BOH (from Hodogaya Chemical Co., Ltd.), Oil Blue #603 (from Orient Chemical Industries, Ltd.), Oil Pink #312 (from Orient Chemical), Oil Red 5B (from Orient Chemical), Oil Scarlet #308 (from Orient Chemical), Oil Red OG (from Orient Chemical), Oil Red RR (from Orient Chemical), Oil Green #502 (from Orient Chemical), Spiron Red BEH Special (from Hodogaya Chemical), m-Cresol Purple, Cresol Red, Rhodamine B, Rhodamine 6G, Sulforhodamine B, Auramine, 4-p-diethylaminophenyliminonaphthoquinone, 2-carboxyanilino-4-p-diethylaminophenyliminonaphthoquinone, 2-carbostearylamino-4-p-di(hydroxyethyl)aminophenyliminona phthoquinone, 1-phenyl-3-methyl-4-p-diethylaminophenylimino-5-pyrazolone, and 1-β-naphthyl-4-p-diethylaminophenylimino-5-pyrazolone.

In order to secure sufficient image visibility, the leuco dye or the dye that reduces its maximum absorption intensity in the visible region by the action of an acid is preferably used in an amount of 0.5 to 20% by weight, particularly 1 to 10% by weight, based on the solids content of the image forming layer.

The lipophilic compound and the dye (the leuco dye or the dye that reduces its maximum absorption intensity in the visible region by the action of an acid includ) are microencapsulated in a known manner. Useful encapsulation techniques include, but are not limited to, coacervation (see U.S. Pat. Nos. 2,800,457 and 2,800,458), interfacial polymerization (see British Patent 990443, U.S. Pat. No. 3,287,154, JP-B-38-19574, JP-B-42-446, and JP-B-42-711), polymer precipitation (see U.S. Pat. Nos. 3,418,250 and 3,660,304), use of isocyanate/polyol wall materials (see U.S. Pat. No. 3,796,669), use of isocyanate wall materials (see U.S. Pat. No. 3,914,511), Use of urea/formaldehyde or urea formaldehyde/resorcinol wall materials (see U.S. Pat. Nos. 4,001,140, 4,087,376, and 4,089,802), use of melamine-formaldehyde resins, hydroxycellulose, etc. as wall materials (see U.S. Pat. No. 4,025,445), in situ polymerization (see JP-B-36-9163 and JP-B-51-9079), spray drying (see British patent 930422 and U.S. Pat. No. 3,111,407), and a method involving melting, dispersing, and cooling (see British Patents 952807 and 967074).

The microcapsule wall preferred in the invention has a three-dimensional crosslinked structure that swells with a solvent. For such properties, preferred wall materials include polyurea, polyurethane, polyester, polycarbonate, polyamide, and mixtures thereof. Polyurea and polyurethane are particularly preferred. It is possible to introduce a heat-reactive functional group into the microcapsule wall.

The average particle size of the microcapsules is preferably 0.01 to 3.0 μm, still preferably 0.05 to 2.0 μm, particularly preferably 0.10 to 1.0 μm, for ensuring satisfactory resolution and stability with time.

The proportion of the microcapsules in the image forming layer is preferably 50% by weight or more, still preferably 60 to 95% by weight, on solid basis based on thew solids content of the image forming layer. Within this range, the image forming layer exhibits excellent sensitivity and developability and promises satisfactory press life.

The acid generator of the image forming layer generates an acid by the action of heat to reduce the absorption intensity of the above-described microencapsulated dye in the visible region or to cause the leuco dye to form a color. While the acid generator may be added inside and/or outside the microcapsules, it is preferred that the acid generator be water-soluble and be added outside the microcapsules so that the above-described dye may be isolated from the acid generator and thereby prevented from forming a color (fogging) during fabrication or storage of a printing plate precursor.

The acid generator for use in the invention is chosen from known compounds that decompose thermally to generate an acid, such as initiators for photocation polymerization, acid generators for forming a printed-out image, and acid generators used in micro resists.

Examples of useful acid generators include trihalomethyl-substituted hetero compounds, iminosulfonate compounds, disulfone compounds, acylphosphine compounds, photo-acid generators having an o-nitrobenzyl protective group, and onium salts represented by formulae (I) to (III) shown below. For the details, reference can be made, e.g., in JP-A-2001-301350, JP-A-2002-29162, JP-A-2002-46361, and Japanese Patent Application No. 2002-225179. Polymers having the above-recited compound or a group derived therefrom introduced into the main or side chain thereof are also useful.

$$Ar^{11}—I^{+}—Ar^{12}.Z^{11-} \quad (I)$$

wherein $Ar^{11}$ and $Ar^{12}$ each represent a substituted or unsubstituted aryl group having 20 or fewer carbon atoms; and $Z^{11-}$ represents a halide ion, a perchlorate ion, a sulfate ion, a tetrafluoroborate ion, a hexafluorophosphate ion, a hexafluoroarsenate ion, a hexafluoroantimonate ion or a sulfonate ion.

The substituents the aryl group $Ar^{11}$ or $Ar^{12}$ may have preferably include a halogen atom, a nitro group, an alkyl group having 12 or fewer carbon atoms, an alkoxy group having 12 or fewer carbon atoms, and an aryloxy group having 12 or fewer carbon atoms. $Z^{11-}$ is preferably a perchlorate ion, a sulfate ion, a tetrafluoroborate ion, a trifluoromethanesulfonate ion or an arylsulfonate ion.

$$Ar^{21}—N^{+}\equiv N.Z^{21-} \quad (II)$$

wherein $Ar^{21}$ represents a substituted or unsubstituted aryl group having 20 or fewer carbon atoms; and $Z^{21-}$ has the same meaning as $Z^{11-}$ of formula (I).

Preferred substituents $Ar^{21}$ may have include a halogen atom, a nitro group, an alkyl group having 12 or fewer carbon atoms, an alkoxy group having 12 or fewer carbon atoms, an aryloxy group having 12 or fewer carbon atoms, an alkylamino group having 12 or fewer carbon atoms, a dialkylamino group having 12 or fewer carbon atoms, an arylamino group having 12 or fewer carbon atoms, and a diarylamino group having 12 or fewer carbon atoms.

(III)

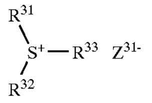

wherein $R^{31}$, $R^{32}$, and $R^{33}$, which may be the same or different, each represent a substituted or unsubstituted hydrocarbon group having 20 or fewer carbon atoms; and $Z^{31-}$ has the same meaning as $Z^{11-}$ of formula (I).

Preferred substituents of the hydrocarbon group $R^{31}$, $R^{32}$, and $R^{33}$ include a halogen atom, a nitro group, an alkyl group having 12 or fewer carbon atoms, alkoxy group having 12 or fewer carbon atoms, and an aryloxy group having 12 or fewer carbon atoms.

Specific examples of the acid generators that are preferably used in the invention are shown below for illustrative purposes only but not for limitation.

(A-1)

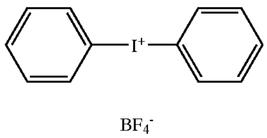

(A-2)

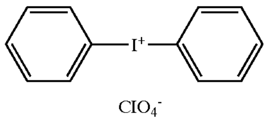

(A-3)

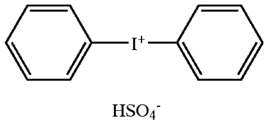

(A-4)

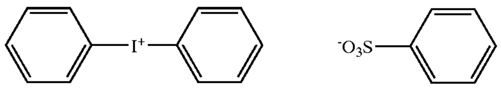

-continued (A-5)

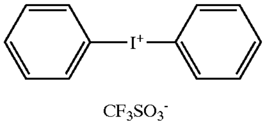

(A-6)

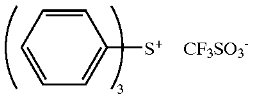

(A-7)

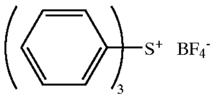

(A-8)

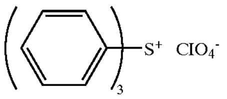

(A-9)

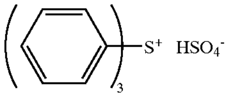

(AS-10)

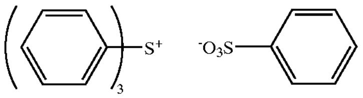

These acid generators can b used either individually or as a combination of two or more thereof. The acid generators are preferably added in a total amount of 0.01 to 20% by weight, particularly 0.1 to 10% by weight, based on the total solids content of the image forming layer. Within this preferred range, a satisfactory print-out effect is exerted.

The light-heat converting substance which can be used in the image forming layer is a substance absorbing infrared rays, particularly near infrared rays (wavelength: 700 to 2000 nm), selected from various known colorants (pigments, dyes, and colors) and fine metal particles. Substances absorbing light of 700 to 1300 nm are particularly preferred.

Suitable colorants and metal particles are described, for example, in *Nippon Insatu Gakkaishi,* "Shin Imaging Zairyo 2. Kinsekigaisen Kyusyu Shikiso", Vol. 38, 35–40 (2001), Nippon Ganryo Gijutu Kyokai (ed.), *Saishin Ganryo Binran* (1977), *Saishin Ganryo Oyo Gijutu,* CMC Shuppan (1986), *Insatu Ink Gijutu,* CMC Shuppan (1984), U.S. Pat. Nos. 4,756,993 and 4,973,572, JP-A-10-268512, JP-A-11-235883, JP-B-5-13514, JP-B-5-19702, JP-A-2001-347765, JP-A-2001-301350, and JP-A-2002-137562. Pigments and metal particles may be subjected to a known surface treatment according to necessity.

The dyes or colors include cyanine colors, polymethine colors, azomethine colors, squarylium colors, pyrylium or thiopyrylium salt dyes, dithiol metal complexes, and phthalocyanine colors, with cyanine colors, squarylium colors, pyrylium salts, and phthalocyanine colors being preferred.

The pigments include insoluble azo pigments, azo lake pigments, condensed azo pigments, chelate azo pigments, phthalocyanine pigments, anthraquinone pigments, perylene or perinone pigments, thioindigo pigments, quinacridone pigments, dioxazine pigments, isoindolinone pigments, quinophthalone pigments, dyed lake pigments, azine pigments, nitroso pigments, nitro pigments, natural pigments, fluorescent pigments, inorganic pigments, and carbon black, with carbon black being preferred.

The metal particles include fine particles of Ag, Au, Cu, Sb, Ge or Pb, with Ag, Au, and Cu particles being preferred.

Particularly preferred of the above-described light-heat converting substances are cyanine colors and phthalocyanine colors disclosed in JP-A-2001-301350 and JP-A-2002-137562.

The light-heat converting substance is incorporated into the image forming layer either by adding directly to a coating composition for image forming layer or microencapsulating together with the dye. The light-heat converting substance is preferably water-soluble where added to a coating composition or lipophilic where microencapsulated.

The light-heat converting substance is preferably used in an amount of 1 to 50% by weight, particularly 3 to 20% by weight, based on the solids content of the image forming layer. Used in this range, the light-heat converting substance secures satisfactory sensitivity without impairing film strength of the image forming layer.

The image forming layer can further contain a hydrophilic resin to improve on-press developability and film strength. Hydrophilic resins which are preferably used in the image forming layer include those having such a hydrophilic group as a hydroxyl group, a carboxyl group, a phosphoric acid group, a sulfonic acid group, an amido group, etc. It is desirable for the hydrophilic resin to have a group reactive with the heat-reactive group of the lipophilic compound present in the microcapsules. In this case, the hydrophilic resin undergoes crosslinking reaction with the heat-reactive group to increase the image strength, which leads to a prolonged press life. Where, for instance, the lipophilic compound possesses a vinyloxy group or an epoxy group, it is preferred for the hydrophilic resin to have a hydroxyl group, a carboxyl group, a phosphoric acid group, a sulfonic acid group, etc. In particular, hydrophilic resins having a hydroxyl group or a carboxyl group are preferred.

Specific examples of suitable hydrophilic resins are gum arabic, casein, gelatin, starch derivatives, soya gum, hydroxypropyl cellulose, methyl cellulose, carboxymethyl cellulose and its sodium salt, cellulose acetate, sodium alginate, vinyl acetate-maleic acid copolymers, styrene-maleic acid copolymers, polyacrylic acids and their salts, polymethacrylic acids and their salts, homo- and copolymers of hydroxyethyl methacrylate, homo- and copolymers of hydroxyethyl acrylate, homo- and copolymers of hydroxypropyl methacrylate, homo- and copolymers of hydroxypropyl acrylate, homo- and copolymers of hydroxybutyl methacrylate, homo- and copolymers of hydroxybutyl acrylate, polyethylene glycols, hydroxypropylene polymers, polyvinyl alcohols, partially hydrolyzedpolyvinyl acetate (degree of hydrolysis: 60% or more, preferably 80% or more, by weight), polyvinyl formal, polyvinylpyrrolidone, homo- and copolymers of acrylamide, homo- and copolymers of methacrylamide, homo- and copolymers of N-methylolacrylamide, homo- and copolymers of 2-acrylamido-2-methyl-1-propanesulfonic acid, and homo- and copolymers of 2-methacryloyloxyethylphosphonic acid.

The amount of the hydrophilic resin to be added is preferably 20% by weight or less, still preferably 10% by weight or less, based on the solids content of the image forming layer.

The hydrophilic resin may previously be cured by crosslinking to such an extent that does not impair the on-press developability of an unexposed area of the image forming layer. Useful crosslinking agents include aldehyde compounds, such as glyoxal, melamine formaldehyde resins, and urea formaldehyde resins; methylol compounds, such as N-methylolurea, N-methylolmelamine, and methylolated polyamide; active vinyl compounds, such as divinylsulfone and bis(β-hydroxyethylsulfonic acid); epoxy compounds, such as epichlorohydrin, polyethylene glycol diglycidyl ether, polyamide-polyamine epichlorohydrin adducts, and polyamide epichlorohydrin resins; esters, such as monochloroacetic esters and thioglycolic esters; carboxylic acid polymers, such as polyacrylic acid and methyl vinyl ether/maleic acid copolymers; inorganic crosslinking agents, such as boric acid, titanyl sulfate, Cu salts, Al salts, Sn salts, V salts and Cr salts; and modified polyamide-polyimide resins. A crosslinking catalyst, such as a silane coupling agent and a titanate coupling agents, can be used in combination.

The image forming layer can further contain necessary additives, such as fine inorganic particles, plasticizers, and surface active agents.

The fine inorganic particles which are preferably incorporated into the image forming layer include silica, alumina, magnesium oxide, titanium oxide, magnesium carbonate, calcium alginate, and mixtures thereof. These inorganic particles, while unable to convert light to heat, contribute to enhance the film strength or roughen the surface of the image forming layer thereby increasing the adhesion to an adjacent layer.

The fine inorganic particles preferably have an average particle size of 5 nm to 10 μm, particularly 100 nm to 1 μm. Such inorganic particles are easily available from the market in the form of, for xample, colloidal silica dispersions. Inasmuch as the particle size of the inorganic particles is within the above range, they are stably dispersible in the hydrophilic resin together with the fine resin particles or the fine metal particles as a light-heat converting substance to contribute to enhance the image forming layer strength and to form a highly hydrophilic and stain-resistant non-image area.

Surface active agents incorporated into the image forming layer serve to improve dispersion stability and coating properties of a coating composition for image forming layer, ease of platemaking, and printing performance of the resulting lithographic printing plate. Surface active agents suitable to these purposes include nonionic, anionic, cationic, amphoteric, or fluorine type ones, such as those described in JP-A-2-195356, JP-A-59-121044, JP-A-4-13149, and JP-A-2002-365789. A recommended amount of the surface active agent to be added is 0.005 to 1% by weight based on the total solids content of the image forming layer.

Plasticizers added to the image forming layer serve to render the coating film flexible. Useful plasticizers include polyethylene glycol, tributyl citrate, diethyl phthalate, dibutyl phthalate, dihexyl phthalate, dioctyl phthalate, tricresyl phosphate, tributyl phosphate, trioctyl phosphate, and tetrahydrofurfuryl oleate.

The image forming layer is formed by coating a support (hereinafter described) with a coating composition prepared by dissolving or dispersing the above-described components in a solvent. Suitable solvents include, but are not limited to, ethylene dichloride, cyclohexanone, methyl ethyl ketone, methanol, ethanol, propanol, ethylene glycolmonomethyl ether, 1-methoxy-2-propanol, 2-methoxyethyl acetate, 1-methoxy-2-propyl acetate, dimethoxyethane, methyl lactate, ethyl lactate, N,N-dimethylacetamide, N,N-dimethylformamide, tetramethylurea, N-methylpyrrolidone, dimethyl sulfoxide, sulfolane, γ-butyrolactone, toluene, and water. These solvents can be used either individually or as a mixture thereof. The solvent is preferably used in an amount to give a solids concentration of 1 to 50% by weight.

While varying depending on the use, the coating composition is applied preferably to a dry coating weight of 0.2 to 5.0 $g/m^2$. The coating composition is applied by various methods, such as bar coating, spin coating, spray coating, curtain coating, dip coating, air knife coating, blade coating, and roll coating.

The printing plate precursor of the invention can have an overcoating layer mainly comprising a water-soluble resin on the image forming layer for the purpose of protecting the image forming layer against contamination with outside lipophilic substances during storage or with fingerprints during handling, as disclosed in JP-A-2001-162961 and JP-A-2002-19318.

The water-soluble resin used to form the overcoating layer includes, but is not limited to, natural resins, such as gum arabic, water-soluble soybean polysaccharides, cellulose derivatives (e.g., carboxymethyl cellulose, carboxyethyl cellulose, and methyl cellulose) and modified cellulose derivatives, white dextrin, pullulan, and enzyme-hydrolyzed and etherified dextrin; and synthetic resins, such as polyvinyl alcohol (at least 65% hydrolyzed polyvinyl acetate), polyacrylic acid and alkali metal or amine salts thereof, acrylic acid copolymers and alkali metal or amine salts thereof, polymethacrylic acid and alkali metal or amine salts thereof, vinyl alcohol/acrylic acid copolymers and alkali metal or amine salts thereof, homo- or copolymers of acrylamide, polyhydroxyethyl acrylate, homo- or copolymers of vinylpyrrolidone, poly (vinyl methyl ether), vinyl methyl ether/maleic anhydride copolymers, poly(2-acrylamido-2-methyl-1-propanesulfonic acid) and alkali metal or amine salts thereof, and 2-acrylamido-2-methyl-1-propanesulfonic acid copolymers and alkali metal or amine salts thereof. These water-soluble resins can be used either individually or as a mixture thereof.

A light-heat converting substance may be incorporated into the overcoating layer to increase sensitivity. Light-heat converting substances suited for use in the overcoating layer include the infrared absorbing colorants recited above for use in the image forming layer which are water-soluble.

Where a coating composition for overcoating layer is an aqueous solution, the coating composition can contain a surface active agent for coating uniformity, usually a nonionic one. Nonionic surface active agents suitable for this purpose include sorbitan tristearate, sorbitan monopalmitate, sorbitan trioleate, glycerol monostearate, polyoxyethylene nonylphenyl ether, and polyoxyethylene dodecyl ether. The nonionic surface active agent is preferably used in an amount of 0.05 to 5% by weight, particularly 1 to 3% by weight, based on the total solids content of the overcoating layer.

In order to prevent the printing plate precursors from sticking to each other when stacked, a compound having a fluorine atom or a silicon atom can be incorporated into the overcoating layer according to the teachings of JP-A-2001-341448.

The thickness of the overcoating layer is preferably 0.1 to 4.0 $\mu$m, still preferably 0.1 to 1.0 $\mu$m. Within this range of thickness, the overcoating layer serves for protection of the image forming layer from contamination while maintaining removability by on-press development.

The support on which the image-forming layer is provided is a water-wettable sheet having dimensional stability. Specific examples of supports are paper, plastic-laminated paper (e.g., paper laminated with polyethylene, polypropylene or polystyrene), a metal plate (e.g., of aluminum, zinc or copper), a plastic film (e.g., of cellulose diacetate, cellulose triacetate, cellulose propionate, cellulose butyrate, cellulose acetate butyrate, cellulose nitrate, polyethylene terephthalate, polyethylene, polystyrene, polypropylene, polycarbonate or polyvinyl acetal), and paper or a plastic film laminated with or deposited with the above-recited metal. Preferred of them are a polyester film and an aluminum plate.

The term "aluminum plate" as used herein is intended to include a pure aluminum plate, a plate of an aluminum-based alloy containing trace amounts of other elements, and a plastic film-laminated aluminum or aluminum alloy foil. The other elements making up the aluminum-based alloy include silicon, iron, manganese, copper, magnesium, chromium, zinc, bismuth, nickel, and titanium. The total content of these other elements in the aluminum alloy is 10% by weight at the most. The aluminum plate may be from an ingot produced either by DC casting or continuous casting. The aluminum plate to be used in the invention can be chosen appropriately from those of materials known in the art and widely available.

The thickness of the support is usually 0.05 to 0.6 mm, preferably 0.1 to 0.4 mm, still preferably 0.15 to 0.3 mm.

The aluminum plate of choice is preferably subjected to surface treatment, such as graining and/or anodizing, for improving water wettability and adhesion to an image forming material provided thereon.

Graining includes mechanical graining, electrochemical graining, chemical graining, and combinations thereof. Mechanical graining is carried out by ball graining, brushing, sandblasting, buffing, or like techniques. Chemical graining of an aluminum plate is suitably carried out by immersion in a saturated aqueous solution of a mineral acid aluminum salt as taught in JP-A-54-31187. Electrochemical graining is carried out by AC or DC electrolysis in an electrolytic solution containing an acid, e.g., hydrochloric acid or nitric acid. Electrolytic graining using a mixed acid as taught in JP-A-54-63902 is also useful.

The surface graining is preferably effected to give an aluminum plate a surface roughness of 0.2 to 1.0 $\mu$m in terms of center-line average roughness Ra. If necessary, the grained aluminum plate is subjected to alkali etching with an aqueous solution of potassium hydroxide, sodium hydroxide, etc., followed by neutralizing. The grained aluminum plate is usually anodized to form an anodized layer for improving wearability. Any electrolyte capable of forming a porous oxide film can be used for anodizing. Sulfuric acid, hydrochloric acid, oxalic acid, chromic acid or a mixture thereof is used generally. The electrolyte concentration depends on the kind. Anodizing conditions are subject to variation according to the kind of the electrolyte. Generally speaking, the electrolyte concentration is 1 to 80% by weight, the liquid temperature is 5 to 70° C., the current density is 5 to 60 A/dm2, the voltage is 1 to 100 V, and the electrolysis time is 10 seconds to 5 minutes. A suitable thickness of the anodized layer is 1.0 to 5.0 g/$m^2$, preferably 1.5 to 4.0 g/$m^2$.

While the anodized aluminum plate may be used as is as a support, it can be subjected to an additional treatment for further improving adhesion to an upper layer (e.g., the image forming layer), water wettability, stain resistance, heat insulation, and the like, such as a pore sealing treatment (see JP-A-2001-253181), a pore widening treatment (see JP-A-2001-322365) or a hydrophilizing treatment by immersion in an aqueous solution of a hydrophilic compound. The hydrophilic compound suitable for the hydrophilizing treatment includes polyvinylphosphonic acid, compounds having a sulfonic acid group, sugar compounds, citric acid, alkali metal silicates, potassium zirconium fluoride, and phosphate/inorganic fluorine compound mixtures.

In using a support whose surface has poor water wettability, such as a polyester film, it is advisable to make the surface water wettable by providing a hydrophilic layer. A preferred hydrophilic layer is made of a coating composition containing an oxide or hydroxide colloid of at least one element selected from berylium, magnesium, aluminum, silicon, titanium, boron, germanium, tin, zirconium, iron, vanadium, antimony, and a transition metal as described in JP-A-2001-199175. A hydrophilic layer formed of a coating composition containing a silicon oxide or hydroxide colloid is particularly preferred.

If desired, a primer coat may be applied to the support before providing an image forming layer. A primer coat includes an inorganic primer coat comprising a water-soluble metal salt (e.g., zinc borate; see JP-A-2001-322365) and an organic primer coat comprising carboxymethyl cellulose, dextrin, polyacrylic acid, etc. The primer coat may contain the above-described infrared absorbing colorant.

The lithographic printing plate precursor according to the invention is capable of imaging by direct imagewise heat application with a thermal recording head, etc. or by imagewise exposure. Imagewise exposure is conducted by scanning with an infrared laser, high-illuminance flash exposure with a xenon lamp, etc., exposure with an infrared lamp, and the like. Exposure with a solid-state, high-output infrared laser (e.g., YAG laser) or a semiconductor laser which emits infrared light having wavelengths of 700 to 1300 nm is preferred. Where the support is transparent, exposure with such a laser can be conducted from the back side of the support.

The imagewise exposed printing plate precursor is mounted on a plate cylinder of a printing press without any processing and on-press-developed through an ordinary operation for starting printing, that is, feeding a fountain solution, printing ink, and paper. On starting the operation, the unexposed area (i.e., non-heated area) of the image forming layer is removed by the contact with a fountain solution, ink, and paper and scraping through the cylinder's rotation. After the on-press development, the resulting printing plate is used to print.

It is possible that the unexposed printing plate precursor is mounted on a plate cylinder, imagewise exposed to light from a laser mounted on the press, and on-press developed by feeding a fountain solution and/or ink as described in Japanese Patent 2938398. It is also possible that mounting on a press is preceded by developing the exposed printing plate precursor with water or an appropriate aqueous solution.

EXAMPLES

The present invention will now be illustrated in greater detail with reference to Examples, but it should be understood that the invention is not construed as being limited thereto. Unless otherwise noted, all the percents are by weight.

1. Preparation of Aluminum Support

A 0.24 mm thick rolled sheet of aluminum (JIS A1050; 99.5% Al, 0.01% Cu, 0.03% Ti, 0.3% Fe, and 0.1% Si; heat conductivity: 0.48 cal/cm·sec·° C.) was grained with a rotating nylon (6,10-nylon) brush and a 20% aqueous slurry of pumice stone (400 mesh; available from KCM Corp.). After thoroughly washing with water, the aluminum plate was immersed in a 15% sodium hydroxide aqueous solution containing 4.5% aluminum ion to etch out 5 $g/m^2$ of aluminum, followed by washing with running water. After neutralizing with 1% nitric acid, the aluminum plate was electrolytically grained in a 0.7% nitric acid aqueous solution containing 0.5% aluminum ion by applying an square wave alternating current voltage having an anode voltage of 10.5 V, a cathode voltage of 9.3 V, and a current ratio (r) of 0.90 (the current wave form described in Example of JP-B-58-5796) at an anode charge of 160 Coulomb/$dm^2$. After washing with water, the plate was immersed in a 10% sodium hydroxide aqueous solution at 35° C. to etch out 1 $g/m^2$ of aluminum, followed by washing with water. The plate was desmutted by immersing in a 30% sulfuric acid aqueous solution at 50° C., followed by washing with water. The plate was anodized in a 20% sulfuric acid aqueous solution (aluminum ion content: 0.8%) at 35° C. using a direct current at a current density of 13 A/$dm^2$ to form a porous anodized film. The electrolysis time was adjusted to give an anodized film weight of 2.7 $g/m^2$. After washing with water, the anodized aluminum plate was immersed in a 0.2% sodium silicate aqueous solution at 70° C. for 30 seconds, washed with water, and dried to prepare an aluminum support.

2. Synthesis of Microcapsules 2-1. Synthesis of Microcapsules (1)

In 60 g of ethyl acetate were dissolved 40 g of a trimethylolpropane xylylene diisocyanate adduct (Takenate D-110N, a microcapsule wall material available from Mitsui Takeda Chemicals, Inc.), 5 g of Crystal Violet Lactone (a leuco dye from Tokyo Kasei Kogyo Co., Ltd.), 15 g of bisphenol A bis (vinyloxyethyl) ether, 5 g of infrared absorbing dye A shown below, and 0.1 g of an anionic surface active agent (Pionin A41C from Takemoto Yushi K. K.) to prepare an oily phase. A 4% aqueous solution of polyvinyl alcohol (PVA 205 from Kuraray Co., Ltd.) was prepared as an aqueous phase (120 g). The oily phase and the aqueous phase were dispersed in a homogenizer at 10,000 rpm for 10 minutes. To the resulting emulsion was added 40 g of water, followed by stirring at room temperature for 30 minutes and then at 40° C. for 3 hours to prepare a microcapsule dispersion having a microcapsule concentration of 25%. The average particle size of the microcapsules was 0.4 μm.

Infrared Absorbing Dye A

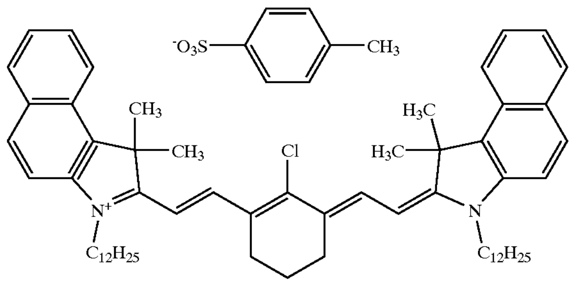

2-2. Synthesis of Microcapsules (2)

In 60 g of ethyl acetate were dissolved 40 g of a trimethylolpropane-xylylene diisocyanate adduct (Takenate D-110N, a microcapsule wall material from Mitsui Takeda Chemicals, Inc.), 5 g of Crystal Violet Lactone (a leuco dye from Tokyo Kasei Kogyo Co., Ltd.), 15 g of bisphenol A epichlorohydrin adduct (Epikote 1004 from Japan Epoxy Resin Co., Ltd.), 5 g of infrared absorbing dye A, and 0.1 g of an anionic surface active agent (Pionin A41C from Takemoto Yushi K. K.) to prepare an oily phase. A 4% aqueous solution of polyvinyl alcohol (PVA 205, from Kuraray Co., Ltd.) was prepared as an aqueous phase (120 g). The oily phase and the aqueous phase were dispersed in a homogenizer at 10,000 rpm for 10 minutes. To the resulting emulsion were added 40 g of water and 1.5 g of tetraethylenepentamine, followed by stirring at room temperature for 30 minutes and then at 40° C. for 3 hours to prepare a microcapsule dispersion having a microcapsule concentration of 25%. The average particle size of the microcapsules was 0.4 μm.

2-3. Preparation of Microcapsules (3)

Microcapsules (3) were prepared in the same manner as for microcapsules (1), except for replacing Crystal Violet Lactone with 3-(N,N-diethylamino)-6-methyl-7-anilinofluoran (from Yamamoto Chemicals, Inc.). The resulting microcapsule dispersion had a microcapsule concentration of 25%. The average particle size of the microcapsules was 0.4 μm.

2-4. Preparation of Microcapsules (4)

Microcapsules (4) were prepared in the same manner as for microcapsules (1), except for replacing Crystal Violet Lactone with Benzoyl Leuco Methylene Blue. The resulting microcapsule dispersion had a microcapsule concentration of 25%. The average particle size of the microcapsules was 0.4 μm.

2-5. Synthesis of Microcapsules (5)

In 60 g of ethyl acetate were dissolved 40 g of a trimethylolpropane xylylene diisocyanate adduct (Takenate D-110N, a microcapsule wall material available from Mitsui Takeda Chemicals, Inc.), 5 g of Victoria Pure Blue BOH (a dye from Hodogaya Chemical), 15 g of bisphenol A bis (vinyloxyethyl) ether, 5 g of infrared absorbing dye A shown above, and 0.1 g of an anionic surface active agent (Pionin A41C from Takemoto Yushi K. K.) to prepare an oily phase. A 4% aqueous solution of polyvinyl alcohol (PVA 205 from Kuraray Co., Ltd.) was prepared as an aqueous phase (120 g). The oily phase and the aqueous phase were dispersed in a homogenizer at 10,000 rpm for 10 minutes. To the resulting emulsion was added 40 g of water, followed by stirring at room temperature for 30 minutes and then at 40° C. for 3 hours to prepare a microcapsule dispersion having a microcapsule concentration of 25%. The average particle size of the microcapsules was 0.4 μm.

2-6. Synthesis of Microcapsules (6)

In 60 g of ethyl acetate were dissolved 40 g of a trimethylolpropane-xylylene diisocyanate adduct (Takenate D-110N, a microcapsule wall material from Mitsui Takeda Chemicals, Inc.), 5 g of Victoria Pure Blue BOH (a dye from Hodogaya Chemical), 15 g of bisphenol A epichlorohydrin adduct (Epikote 1004 from Japan Epoxy Resin Co., Ltd.), 5 g of infrared absorbing dye A, and 0.1 g of an anionic surface active agent (Pionin A41C from Takemoto Yushi K. K.) to prepare an oily phase. A4% aqueous solution of polyvinyl alcohol (PVA 205, from Kuraray Co., Ltd.) was prepared as an aqueous phase (120 g). The oily phase and the aqueous phase were dispersed in a homogenizer at 10,000 rpm for 10 minutes. To the resulting emulsion were added 40 g of water and 1.5 g of tetraethylenepentamine, followed by stirring at room temperature for 30 minutes and then at 40° C. for 3 hours to prepare a microcapsule dispersion having a microcapsule concentration of 25%. The average particle size of the microcapsules was 0.4 μm.

2-7. Preparation of Microcapsules (7)

Microcapsules (7) were prepared in the same manner as for microcapsules (5), except for replacing Victoria Pure Blue BOH with Ethyl Violet. The resulting microcapsule dispersion had a microcapsule concentration of 25%. The average particle size of the microcapsules was 0.4 μm.

2-8. Preparation of Comparative Microcapsules Containing no Dye

Comparative microcapsules were synthesized in the same manner as for microcapsules (1), except that Crystal Violet Lactone was not used in the oily phase and that the amount of water added to the emulsion was changed from 40 g to 25 g. The resulting microcapsule dispersion had a microcapsule concentration of 25%. The average particle size of the microcapsules was 0.4 μm.

Example 1

A coating composition for image forming layer having the formulation shown below was applied to the aluminum support with a bar coater to a dry coating weight of 1.0 g/m$^2$ and dried in an oven at 80° C. for 90 seconds to prepare a lithographic printing plate precursor.

Coating Composition for Image Forming Layer:

| | |
|---|---|
| Water | 100 g |
| Microcapsules (1) (on a solid basis) | 5 g |
| Acid generator A-5 | 0.5 g |
| Fluorine type surface active agent (Megafac F-171 from Dainippon Ink & Chemicals, Inc.) | 0.05 g |

The resulting printing plate precursor was imaged on a Creo Trendsetter 3244VX equipped with a water-cooled 40 W infrared semiconductor laser under conditions of an output power of 17 W, an external drum rotation speed of 150 rpm, an energy density of 200 mJ/cm$^2$ at the image plane, and a resolution of 2400 dpi. The exposed area turned purple blue to form a printed-out image with a contrast enough to be distinguished from the unexposed area. The density difference between the exposed and unexposed areas was 0.35 measured with a reflection densitometer Gretag Macbeth D19C.

The plate precursor as exposed was mounted on the plate cylinder of a printing machine, Heidelberg SOR-M. A fountain solution consisting of an etching solution EU-3 (from Fuji Photo Film Co., Ltd.), water, and isopropyl alcohol at a volume ratio of 1/89/10 and then a black ink Geos G (from Dainippon Ink & Chemicals, Inc.) were fed to the plate, and paper was fed to the printing machine to carry out printing. As a result, the plate was developed on press and became capable of printing. Close observation of the 10th copy with a 20× magnifier revealed excellent density uniformity on the solid image area and no stains due to scumming. Printing was continued to get more than 20,000 impressions without fine lines and text missing, density unevenness in a solid image area, and scumming.

Example 2

A lithographic printing plate precursor was produced in the same manner as in Example 1, except for using the microcapsules (2) in place of the microcapsules (1). On imagewise exposure, the exposed area turned purple blue to form a printed-out image with a contrast enough to be distinguished from the unexposed area. The density difference between the exposed and unexposed areas was 0.35 measured with Gretag Macbeth D19C. On printing in the same manner as in Example 1, the plate precursor was developed on press and became capable of printing. Close observation of the 10th copy with a 20× magnifier revealed excellent density uniformity on the solid image area and no stains on the non-image area. Printing was continued to get more than 20,000 impressions without causing fine lines and text missing, density unevenness in a solid image area and scumming.

Example 3

A lithographic printing plate precursor was produced in the same manner as in Example 1, except for using the microcapsules (3) in place of the microcapsules (1). On imagewise exposure, the exposed turned black to form a printed-out image with a contrast enough to be distinguished from the unexposed area. The density difference between the exposed and unexposed areas was 0.36 measured with Gretag Macbeth D19C. On printing in the same manner as in Example 1, the plate precursor was developed on press and became capable of printing. Close observation of the 10th copy with a 20× magnifier revealed excellent density uniformity on the solid image area and no stains on the non-image area. Printing was continued to get more than 20,000 impressions without causing fine lines and text missing, density unevenness in a solid image area, and scumming.

Example 4

A lithographic printing plate precursor was produced in the same manner as in Example 1, except for using the microcapsules (4) in place of the microcapsules (1). On imagewise exposure, the exposed turned bluish green to form a printed-out image with a contrast enough to be distinguished from the unexposed area. The density difference between the exposed and unexposed areas was 0.33 measured with Gretag Macbeth D19C. On printing in the same manner as in Example 1, the plate precursor was developed on press and became capable of printing. Close observation of the 10th copy with a 20× magnifier revealed excellent density uniformity on the solid image area and no stains on the non-image area. Printing was continued to get more than 20,000 impressions without causing fine lines and text missing, density unevenness in a solid image area, and scumming.

Example 5

A lithographic printing plate precursor was produced in the same manner as in Example 1, except for using the microcapsules (5) in place of the microcapsules (1).

The resulting printing plate precursor was imaged on a Creo Trendsetter 3244VX equipped with a water-cooled 40 W infrared semiconductor laser under conditions of an output power of 17 W, an external drum rotation speed of 150 rpm, an energy density of 200 $mJ/cm^2$ at the image plane, and a resolution of 2400 dpi. The exposed area had a reduced density to form a printed-out image with a contrast enough to be distinguished from the unexposed area. The density difference between the exposed and unexposed areas was 0.2 measured with a reflection densitometer Gretag Macbeth D19C.

The plate precursor as exposed was mounted on the plate cylinder of a printing machine, Heidelberg SOR-M. A fountain solution consisting of an etching solution EU-3 (from Fuji Photo Film Co., Ltd.), water, and isopropyl alcohol at a volume ratio of 1/89/10 and then a black ink Geos G (from Dainippon Ink & Chemicals, Inc.) were fed to the plate, and paper was fed to the printing machine to carry out printing. As a result, the plate was developed on press and became capable of printing. Close observation of the 10th copy with a 20× magnifier revealed excellent density uniformity on the solid image area and no stains due to scumming. Printing was continued to get more than 20,000 impressions without fine lines and text missing, density unevenness in a solid image area, and scumming.

Example 6

A lithographic printing plate precursor was produced in the same manner as in Example 1, except for using the microcapsules (6) in place of the microcapsules (1). After imagewise exposure, the exposed area had a reduced density to form a printed-out image with a contrast enough to be distinguished from the unexposed area. The density difference between the exposed and unexposed areas was 0.2 measured with Gretag Macbeth D19C. On printing in the same manner as in Example 1, the plate precursor was developed on press and became capable of printing. Close observation of the 10th copy with a 20× magnifier revealed excellent density uniformity on the solid image area and no stains on the non-image area. Printing was continued to get more than 20,000 impressions without causing fine lines and text missing, density unevenness in a solid image area and scumming.

Example 7

A lithographic printing plate precursor was produced in the same manner as in Example 1, except for using the microcapsules (7) in place of the microcapsules (1). After imagewise exposure, the exposed area had a reduced dye density to form a printed-out image with a contrast enough to be distinguished from the unexposed area. The density difference between the exposed and unexposed areas was 0.3 measured with Gretag Macbeth D19C. On printing in the same manner as in Example 1, the plate precursor was developed on press and became capable of printing. Close observation of the 10th copy with a 20× magnifier revealed excellent density uniformity on the solid image area and no stains on the non-image area. Printing was continued to get more than 20,000 impressions without causing fine lines and text missing, density unevenness in a solid image area, and scumming.

Comparative Example 1

A lithographic printing plate precursor was produced in the same manner as in Example 1, except for using the comparative microcapsules in place of the microcapsules (1). When imagewise exposed, the plate was difficult to distinguish between image and non-image areas. The density difference between the image and non-image areas was 0.06 measured with Gretag Macbeth D19C.

It is seen from these results that the lithographic printing plate precursor according to the present invention is capable of forming a printed-out image on imagewise exposure that is easy to distinguish from the unexposed area and exhibits satisfactory on-press developability to provide a lithographic printing plate having stain resistance and satisfactory impression capacity.

The present invention provides a lithographic printing plate precursor which is fit for imaging by infrared scanning exposure based on digital signals and for on-press development and capable of forming a printed-out image on imagewise exposure.

This application is based on Japanese Patent application JP 2002-251932, filed Aug. 29, 2002, and JP 2002-251933, filed Aug. 29, 2002, the entire contents of those are hereby incorporated by reference, the same as if set forth at length.

What is claimed is:

1. An on-press developable heat-sensitive lithographic printing plate precursor comprising:

a support having a water-wettable surface; and an image forming layer, wherein the image forming layer comprises microcapsules containing a lipophilic compound and a leuco dye which forms a color by an action of an acid, an acid generator capable of generating an acid on heat application, and a light-heat converting substance.

2. The lithographic printing plate precursor according to claim 1, wherein the acid generator is water-soluble, present outside the microcapsules, and isolated from the microencapsulated leuco dye.

3. The lithographic printing plate precursor according to claim 1, wherein an amount of the leuco dye is 0.5 to 20% by weight based on solids content of the image forming layer.

4. The lithographic printing plate precursor according to claim 1, wherein an amount of the leuco dye is 1 to 10% by weight based on solids content of the image forming layer.

5. The lithographic printing plate precursor according to claim 1, wherein the microcapsules have an average particle size of 0.01 to 3.0 $\mu$m.

6. The lithographic printing plate precursor according to claim 1, wherein an amount of the microcapsules in the image forming layer is 50% by weight or more on solid basis based on the solids content of the image forming layer.

7. The lithographic printing plate precursor according to claim 1, wherein the lipophilic compound is a compound comprising a heat-reactive functional group.

8. The lithographic printing plate precursor according to claim 7, wherein the heat-reactive functional group is capable of undergoing radical polymerization or cation polymerization.

9. The lithographic printing plate precursor according to claim 7, wherein the heat-reactive functional group is at least one group selected from the group consisting of a vinyl group, an acryloyl group, a methacryloyl group, an allyl group, a vinyloxy group and an epoxy group.

10. An on-press developable heat-sensitive lithographic printing plate precursor comprising:

a support having a water-wettable surface; and an image forming layer, wherein the image forming layer comprises microcapsules containing a lipophilic compound and a dye which reduces the maximum absorption intensity in a visible region by an action of an acid, an acid generator capable of generating an acid on heat application, and a light-heat converting substance.

11. The lithographic printing plate precursor according to claim 10, wherein the acid generator is water-soluble, present outside the microcapsules, and isolated from the microencapsulated dye.

12. The lithographic printing plate precursor according to claim 10, wherein an amount of the leuco dye is 0.5 to 20% by weight based on solids content of the image forming layer.

13. The lithographic printing plate precursor according to claim 10, wherein an amount of the leuco dye is 1 to 10% by weight based on solids content of the image forming layer.

14. The lithographic printing plate precursor according to claim 10, wherein the microcapsules have an average particle size of 0.01 to 3.0 $\mu$m.

15. The lithographic printing plate precursor according to claim 10, wherein an amount of the microcapsules in the image forming layer is 50% by weight or more on solid basis based on the solids content of the image forming layer.

16. The lithographic printing plate precursor according to claim 10, wherein the lipophilic compound is a compound comprising a heat-reactive functional group.

17. The lithographic printing plate precursor according to claim 16, wherein the heat-reactive functional group is capable of undergoing radical polymerization or cation polymerization.

18. The lithographic printing plate precursor according to claim 16, wherein the heat-reactive functional group is at least one group selected from the group consisting of a vinyl group, an acryloyl group, a methacryloyl group, an allyl group, a vinyloxy group and an epoxy group.

* * * * *